United States Patent
Hung et al.

(10) Patent No.: US 11,088,036 B2
(45) Date of Patent: Aug. 10, 2021

(54) ATOM PROBE TOMOGRAPHY SPECIMEN PREPARATION

(71) Applicant: Taiwan Semiconductor Manufacturing Co., Ltd., Hsinchu (TW)

(72) Inventors: Shih-Wei Hung, Kaohsiung (TW); Jang Jung Lee, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/449,138

(22) Filed: Jun. 21, 2019

(65) Prior Publication Data

US 2020/0043813 A1    Feb. 6, 2020

Related U.S. Application Data

(60) Provisional application No. 62/712,759, filed on Jul. 31, 2018.

(51) Int. Cl.

| H01L 21/76 | (2006.01) |
| H01L 21/66 | (2006.01) |
| H01L 21/768 | (2006.01) |
| H01J 37/285 | (2006.01) |
| H01L 29/45 | (2006.01) |

(52) U.S. Cl.
CPC .......... *H01L 22/14* (2013.01); *H01J 37/285* (2013.01); *H01L 21/76849* (2013.01); *H01L 22/30* (2013.01); *H01L 29/45* (2013.01)

(58) Field of Classification Search
CPC combination set(s) only.
See application file for complete search history.

(56) References Cited

U.S. PATENT DOCUMENTS

| 9,240,236 B1* | 1/2016 | Barabash .............. H01L 45/146 |
| 2007/0178713 A1* | 8/2007 | Jeng .................... H01L 21/7682 438/787 |
| 2015/0295018 A1* | 10/2015 | Lao ........................ H01L 29/665 257/506 |
| 2016/0064385 A1* | 3/2016 | Chang ................... H01L 23/642 257/303 |
| 2020/0152781 A1* | 5/2020 | Manipatruni ....... H01L 29/1037 |

* cited by examiner

*Primary Examiner* — Moin M Rahman
(74) *Attorney, Agent, or Firm* — Seed IP Law Group LLP (57) ABSTRACT

The disclosure is directed to techniques in preparing an atom probe tomography ("APT") specimen. A structure in a semiconductor device is identified as including a test object for an APT procedure. A target region is identified in the structure where an APT specimen will be obtained. The target region is analyzed to determine whether a challenging component feature exists therein. A challenging component may include a hard-to-evaporate material, a hollow region, or a material unidentifiable with respect to the test object, or other structural features that pose a challenge to a successful APT analysis. If it is determined that a challenging component exists in the target region, the challenging component is replaced with a more suitable material before the APT specimen is prepared.

17 Claims, 8 Drawing Sheets

ATOM PROBE TOMOGRAPHY SPECIMEN PREPARATION

BACKGROUND

Atom probe tomography (APT) has become a promising approach to analyze dopant concentration or distribution in various semiconductor regions of a semiconductor device or structure. In APT, ions are removed from a surface of an APT specimen through application of an electrical pulse, which is referred to as field evaporation. The evaporated ions are imaged and identified based on their mass spectrum peaks in a mass spectrometer. The lateral location of the ions at the surface(s) of the APT specimen is determined based on, e.g., through a time-of-flight sensing mechanism, a time interval for a decoupled ion to travel to a detector. The identified ions and the determined locations thereof are analyzed to reconstruct the specimen with the locations of each ion identified.

The APT is especially desirable for dopant analysis of finFET devices or gate-all-around (GAA) devices because of the APT's three-dimensional (3D) reconstruction capacity.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

The current techniques in accordance with embodiments described herein are created based on the observation that the existence of some structural features of a semiconductor structure have a negative impact on the yield of an atom probe tomography (APT) analysis. For example, some materials have high evaporation field strengths, or "evaporation field" (measured with V/nm), which makes it very difficult for such material to evaporate in the field evaporation of an APT procedure. That is, the ions of such materials cannot be removed from the surface of the APT specimen having such materials. As the field evaporation removes the ions from the surface of the APT specimen in a layer-by-layer manner, the hard-to-remove material will block the field evaporation of other materials underlying the hard-to-remove material. As such, ions of the underlying materials cannot be removed from the APT specimen surface. Further, the existence of the hard-to-remove ions will block the travelling of other ions that are removed from the surface of the specimen, which distorts the time-of-flight calculation results and the location determination of the affected ions.

A semiconductor structure may also include a structure with a fluid content, e.g., a gas or liquid content. The structure with a fluid content may be formed intentionally or unintentionally. For example, a hollow structure, i.e., a gap region with air filled therein, may be intentionally formed for electrostatic purposes or may be unintentionally formed due to imperfect deposition processes. Such structures with fluid content are referred to herein as "hollow regions" for descriptive purposes. A hollow region poses challenges to the APT procedure because if a hollow region is included in an APT specimen, a fracture will occur in the field evaporation process of the APT specimen, which distorts or fails the 3D reconstruction of the semiconductor structure as represented by the APT specimen.

Further, an APT procedure may fail due to low identifiability or differentiation among the ions removed from adjacent surface regions/layers of the APT specimen. APT uses the mass spectrum image to identify an ion. Two ions having overlapping or adjacent mass spectrum peaks may confuse the APT, which fails the 3D reconstruction. In the description herein, ions having overlapping or adjacent mass spectrum peaks are referred to as "unidentifiable" with respect to one another, for descriptive purposes.

The disclosed techniques improve the APT technique by replacing such challenging components with materials more suitable for APT procedure. A structure, region, or layer in a semiconductor structure is identified as a test object for an APT procedure. A region that includes at least a portion of the test object is identified as being where an APT specimen will be obtained from, which is referred to as a target region. The target region is analyzed to determine whether a challenging component exists in the target region. A challenging component may include a hard-to-evaporate material, a hollow region, or an unidentifiable material with respect to that of the test object, or other structural or material features that pose a challenge to a successful APT procedure. If it is determined that a challenging component exists in the target region, the challenging component is removed or opened, and a more suitable material is deposited in the open space.

For example, in analyzing a source/drain dopant of a finFET structure, a tungsten contact plug contacting the source/drain structure is identified as a challenging component because tungsten is very difficult to evaporate in field evaporation, with an evaporation field up to 102/57/52 V/nm for various levels of electronic charges in the APT. Other hard-to-remove materials include Re, Ir, Pt, Au, Nb, Mo, Ru, or Rh. The APT procedure focuses on the mid-range of the APT specimen, and the tip of the APT specimen will include some portion of the tungsten plug. That is, the tungsten plug is within the target region. A chemical mechanical polishing or a patterning procedure is conducted to expose the tungsten plug structure. The tungsten is removed by etching. A capping material is deposited within the open place where the tungsten plug is to be removed. The capping material is selected to be easy to evaporate, and identifiable with respect to nearby structures, e.g., the source/drain structure and/or the dielectric layer surrounding the capping material. In an embodiment, the capping material is one or more of a carbon- and oxygen-based organic material, cobalt ("Co"), nickel ("Ni"), aluminum oxide ("$Al_2O_3$"), zinc oxide ("ZnO"), titanium dioxide ("$TiO_2$") and/or other suitable materials that are easy to evaporate in an APT procedure. In an embodiment, the capping material is deposited using a deposition process that has a good gap-filling capacity such that no hollow region is formed. For example, atomic layer deposition ("ALD") or molecular layer deposition ("MLD") is used for forming the capping material. The ALD or MLD may not be suitable for forming a high aspect ratio structure. As such, the polishing procedure, e.g., CMP, or the patterning procedure, e.g., plasma etching, that expose the tungsten plug also reduce the height of the tungsten plug. As a result, the aspect ratio of the capping material structure that replaces the tungsten plug is also reduced. After the capping material is formed replacing the tungsten plug, an APT specimen is prepared from the target region, which includes a source/drain portion in the mid-range and the capping material at the tip of the specimen.

In another embodiment, a semiconductor structure includes an embedded built-in test element. The built-in test element functions as a target region to obtain an APT specimen to test the characteristics of another operational device on the semiconductor structure. A semiconductor device or structure that includes function more than or other than being used for obtaining an APT specimen is referred to as an "operational device" for descriptive purposes. The built-in test element is used to prepare an APT specimen to test the characteristics of a corresponding operational device. The built-in test element is configured to be identical to the corresponding operational device, except that the test element includes a substitute component of a capping material instead of a challenging component that exists in or adjacent to the operational device or structure.

For example, in an embodiment, the built-in test element includes exactly a same transistor device as an operational device, except that the transistor of the operational device is connected to a tungsten interconnection structure, like a contact plug, and the transistor in the built-in test element is connected to a dummy contact plug of a capping material that is more suitable for the APT procedure, e.g., a carbon- and oxygen-based organic material, than tungsten.

In another example, the built-in test element includes exactly a same structure as a transistor in a corresponding operational device except that the transistor in the operational device includes a metal gate and the built-in test element includes a sacrificial gate of, e.g., polysilicon. The built-in test element may be formed by keeping the sacrificial gate structure in some of the semiconductor structures when replacement metal gates are formed in other semiconductor structures that are otherwise identical. As such, the built-in test elements and the corresponding operational devices are very similar to one another with respect to all the structural features or characteristics except for the challenging components and the substitute components. In a case that the test object of the APT procedure is other than the challenging components, the built-in test element is a suitable base for preparing the APT specimen.

The technique of substituting a capping component of an APT-friendly capping material for a challenging component may be used for any layers or structures in a semiconductor device. For example, besides tungsten, iridium ("Ir"), tantalum ("Ta"), rhenium ("Re") are among the metal materials that are difficult to remove through field evaporation. Some compound materials like silicon nitride, silicon carbide, titanium nitride, and tantalum nitride are also difficult to evaporate in an APT procedure. All such hard-to-evaporate materials in a target region may be removed and replaced with APT-friendly capping materials before an APT specimen is obtained from the target region of a semiconductor structure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1:
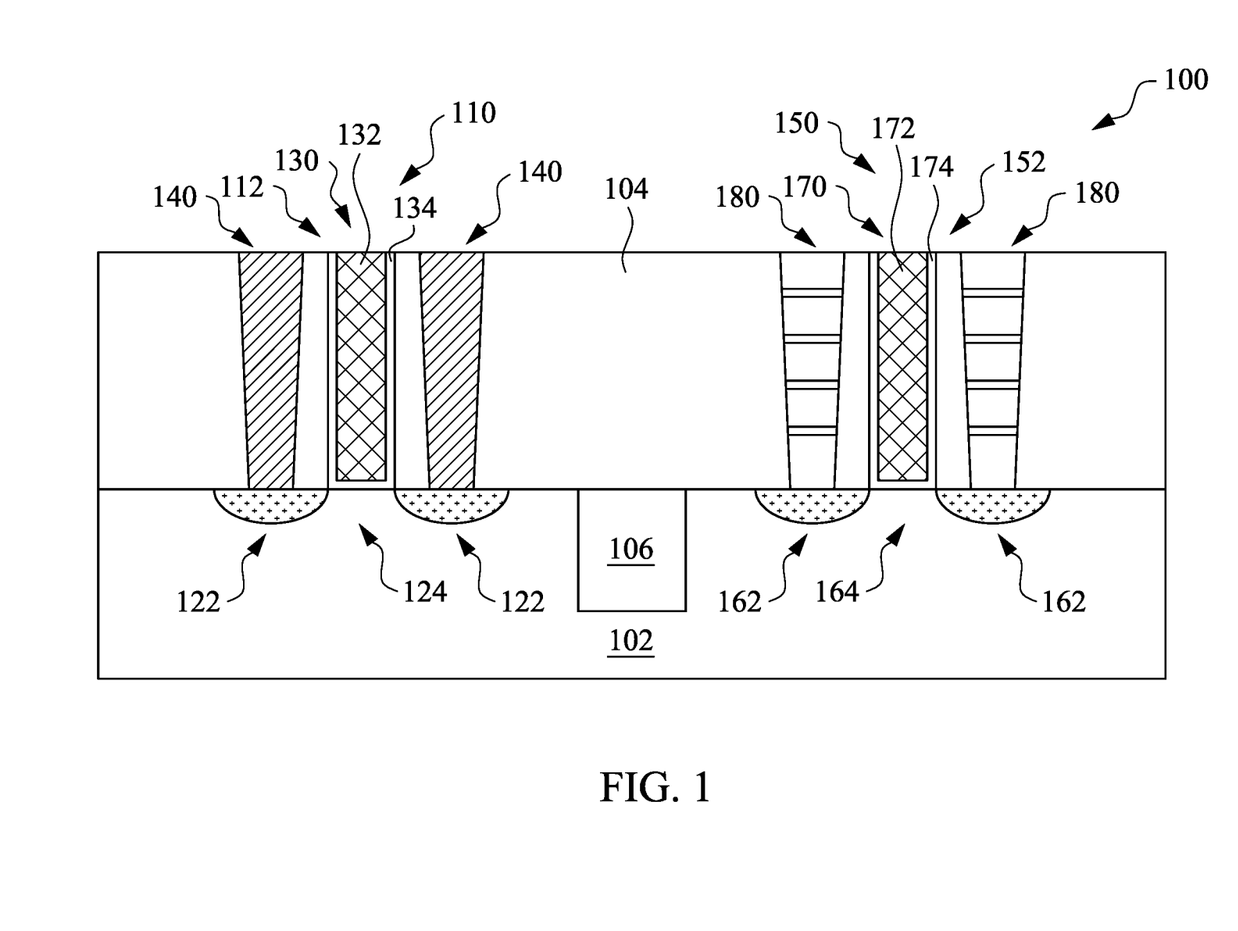
FIG. 1 is an example wafer according to example embodiments of the disclosure.

FIG. 1 shows an example semiconductor wafer 100. As shown in FIG. 1, the wafer 100 includes a substrate 102, e.g., a silicon substrate, multiple insulation regions, e.g., a shallow trench insulation region ("STI") 106, in the substrate 102 and one or more interlayer dielectric layer 104 over the substrate 102. The wafer 100 includes a first structure 110 and a second structure 150 that are separated by the STI 106. The first structure 110 includes a first semiconductor structure 112, and the second structure 150 includes a second semiconductor structure 152. In an embodiment, the first semiconductor structure 112 and the second semiconductor structure 152 are substantially similar to one another in that the source/drain region 122, the body 124, and the gate structure 130 of the first semiconductor structure 112 are each very similar to the source/drain region 162, the body 164, and the gate structure 170 of the second semiconductor structure 152. The first structure 110 includes a contact plug 140 connecting to the source/drain region 122 of the first semiconductor structure 112. The second structure 150 includes a dummy contact 180 that contacts the source/drain region 162 in a similar manner as the contact plug 140 connecting to the source/drain region 122. The dummy contact 180 includes a different material from that of the contact plug 140. In an embodiment, the contact plug structure 140 is tungsten and the dummy structure 180 includes a material that has a lower evaporation field than tungsten and is easier to evaporate in an APT procedure. In an embodiment, the dummy structure 180 is one or more of a carbon- and oxygen-based organic material, cobalt ("Co"), nickel ("Ni"), aluminum oxide ("$Al_2O_3$"), zinc oxide ("ZnO"), titanium dioxide ("$TiO_2$") and/or other suitable materials that are easy to evaporate in an APT procedure.

In an embodiment, the first structure 110 is configured as an operational structure that conducts the normal operation of an integrated circuit having the first structure 110. The second structure 150 is a test structure dedicated for making a specimen for an APT procedure to analyze the structural or composition characteristics of the operational structure 110. In the design of the wafer 100, the test structure 150 is a replica of the operational structure 110 except for the dummy contact 180, which corresponds to and substitutes for the contact plug 140. As the dummy contact 180 basically substitutes for the contact plug 140 in the operational structure 110, the dummy structure 180 is also referred to as a "substitute component" for descriptive purposes.

FIG. 1 illustrates one example that the test structure 150 has a substitute component 180 that substitutes for the contact plug 140 of the operational structure 110. This illustrative example does not limit the scope of the disclosure. A substitute component of the test structure 150 may correspond to, or substitute for, other structures of the operational structure 110, like the gate structure 130, the dielectric layers 104, the etch stop layers, a hollow region, or any regions/structures of the operational structure 110 that pose challenges to a successful APT procedure.

For example, as shown in FIG. 1, the gate structure 130 of the operational structure 110 is substantially identical to the gate structure 170 in the test element 150. Specifically, the gate dielectric 134 and the gate electrode 132 of the gate structure 130 are substantially identical to the gate dielectric 174 and gate electrode 172 of the gate structure 170, respectively. In an alternative or additional embodiment, the gate structure 170 may be different from the gate structure 130 in that the gate structure 170 is a dummy gate with element 172 being a sacrificial material, e.g., polysilicon.

FIG. 1 shows that the substitute component 180 is a structure that is formed in similar location(s), relative to the test object, as the corresponding contact plug 140 of the operational structure 110, and has a different material. However, the substitute component 180 may not necessarily be an actual structural element that is separate from the surrounding layers/structures. In other embodiments, the substitute component 180 may not be a separate structural element, and may just reference to a different material deposited in the location that corresponds to the relevant challenging components in the operational structure 110. That is, the substitute components 180 may not be an actual structural feature and may not be separately formed. For example, a substitute component may be formed by intentionally missing a process step of forming the corresponding challenging component(s) in the operational structure 110.

Figure 2:
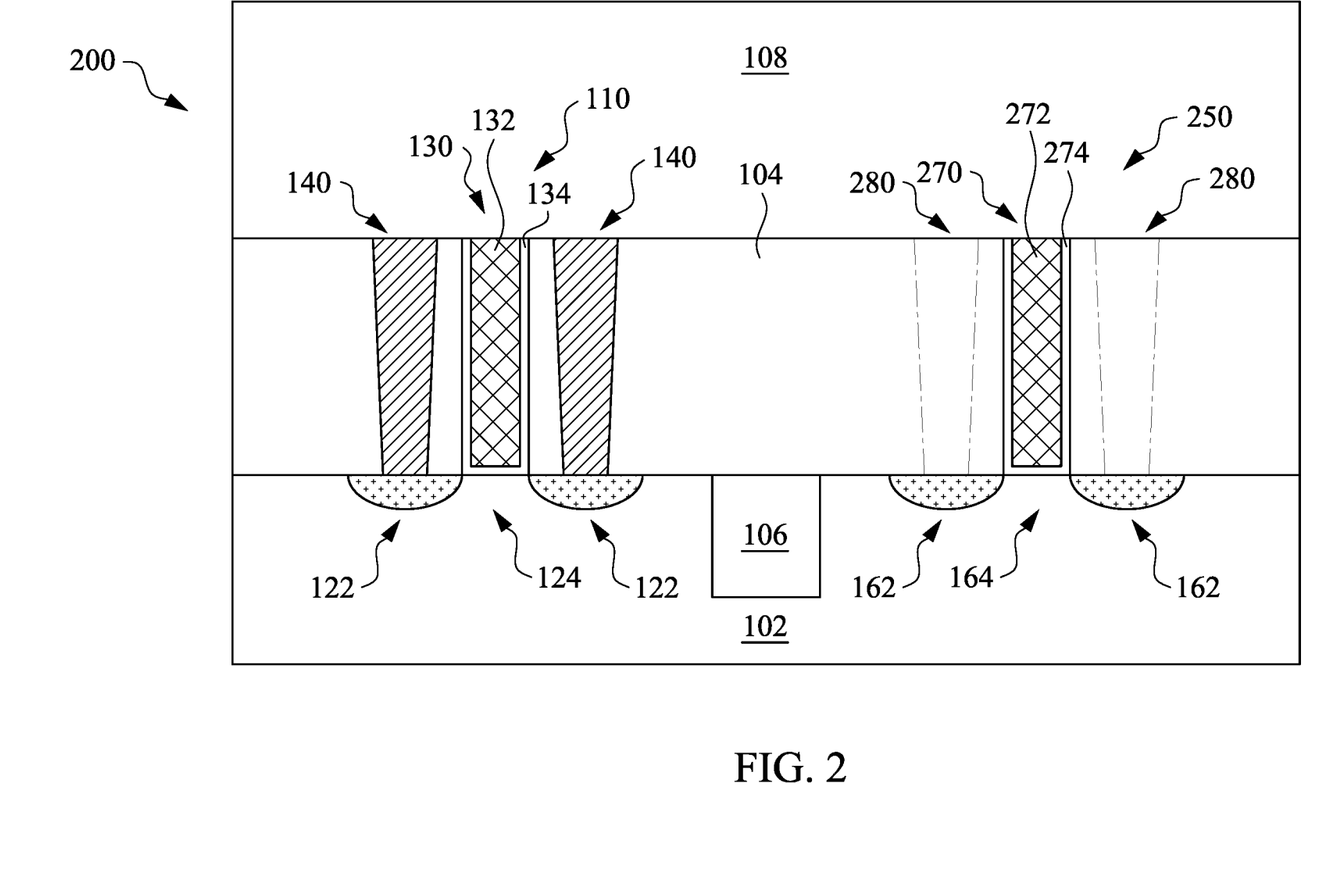
FIG. 2 is another example wafer according to example embodiments of the disclosure.

For example, FIG. 2 shows an alternative or additional embodiment of a wafer 200. The wafer 200 includes some similar structure features as the wafer 100 of FIG. 1, which are referred to using the same reference numerals. The descriptions of the similar structural features are omitted for simplicity purposes. In the wafer 200, a test structure 250 includes the source/drain regions 162 and the semiconductor body 164 that are similar to the source/drain regions 122 and the semiconductor body 124 of the operational structure 110. The substitute component 270 of the test structure 250 is different from the gate structure 130 of the operational structure 110 in the materials thereof. In an embodiment, the substitute component 270 is a dummy gate with sacrificial material that remains in place while the sacrificial materials of other gates are replaced with metal gate materials. That is, a replacement gate formation process is conducted to form the gate structures 130 of the operational structure 110, while the replacement gate formation process is omitted for the test element 250. The replacement gate formation process is intentionally missed for the test structure 250 because the sacrificial material of polysilicon is more suitable for an APT procedure, and is easier to evaporate than the metal gate electrode 132. The dielectric layer 274 of the dummy gate 270 may be a same dielectric material as the gate dielectric layer 134 of the gate structure 130 or may be a different dielectric material.

At the spaces 280, shown with dotted lines in FIG. 2, which correspond to the contact plug 140 of the operational structure 110, no separate structure is formed and the same dielectric material of the interlayer dielectric layer 104 occupies the spaces 280. That is, the spaces 280 include different materials from the corresponding contact plug 140, and are therefore substitute components 280. The substitute components 280 are formed by missing the damascene process of forming the contact plug 140 of an operational structure 110.

Other than the substitute components 270, 280, the test structure 250 is formed similarly as the operational structure 110. The substitute components 270, 280 include materials that are easy to evaporate in an APT procedure, as compared to the corresponding gate structure 130 and the contact plug 140, respectively. Therefore, an APT specimen taken from the test structure 250 provides an enhanced APT test result yield.

In an embodiment, the test structures 150, 250 in the wafers 100, 200 may be built-in test structures. That is, the test structures 150, 250 are formed together with the corresponding operational structures 110 and stay in the integrated circuit ("IC") system. For example, as shown in FIG. 2 as an illustrative embodiment, the built-in test element 250 and the operational structure 110 are overlaid by a same dielectric material 108 where other interconnect structures and/or metal features are formed therein. The existence of the built-in test structures 150, 250 enables the sampling of the wafers or ICs in the testing stage, e.g., testing of the dopant concentration or distribution within the source/drain regions 122, the body 124, and/or the interface between the source/drain region 122 and the body 124. The built-in test element 150, 250 also can help in evaluating an IC product in the circuit application or other use scenarios. The built-in test structures 150, 250 may be designated for a whole wafer or for a die of an IC segmented from a wafer. For example, the operational structure 110 and the built-in test structure 150, 250 may be positioned in a region of a wafer designated to be segmented into a die for an IC.

In another embodiment, the test structures 150, 250 in the wafers 100, 200 are separately made for the purposes of APT analysis in a procedure separate from the wafer fabrication process. That is, a wafer 100, 200, either as a fully fabricated wafer or as a partially fabricated wafer, is selected for an APT analysis procedure, and the test structures 150, 250 are made on the wafer 100, 200 to substitute for a challenging component that already exists in the fully fabricated or partially fabricated wafer 100, 200.

Figure 3:
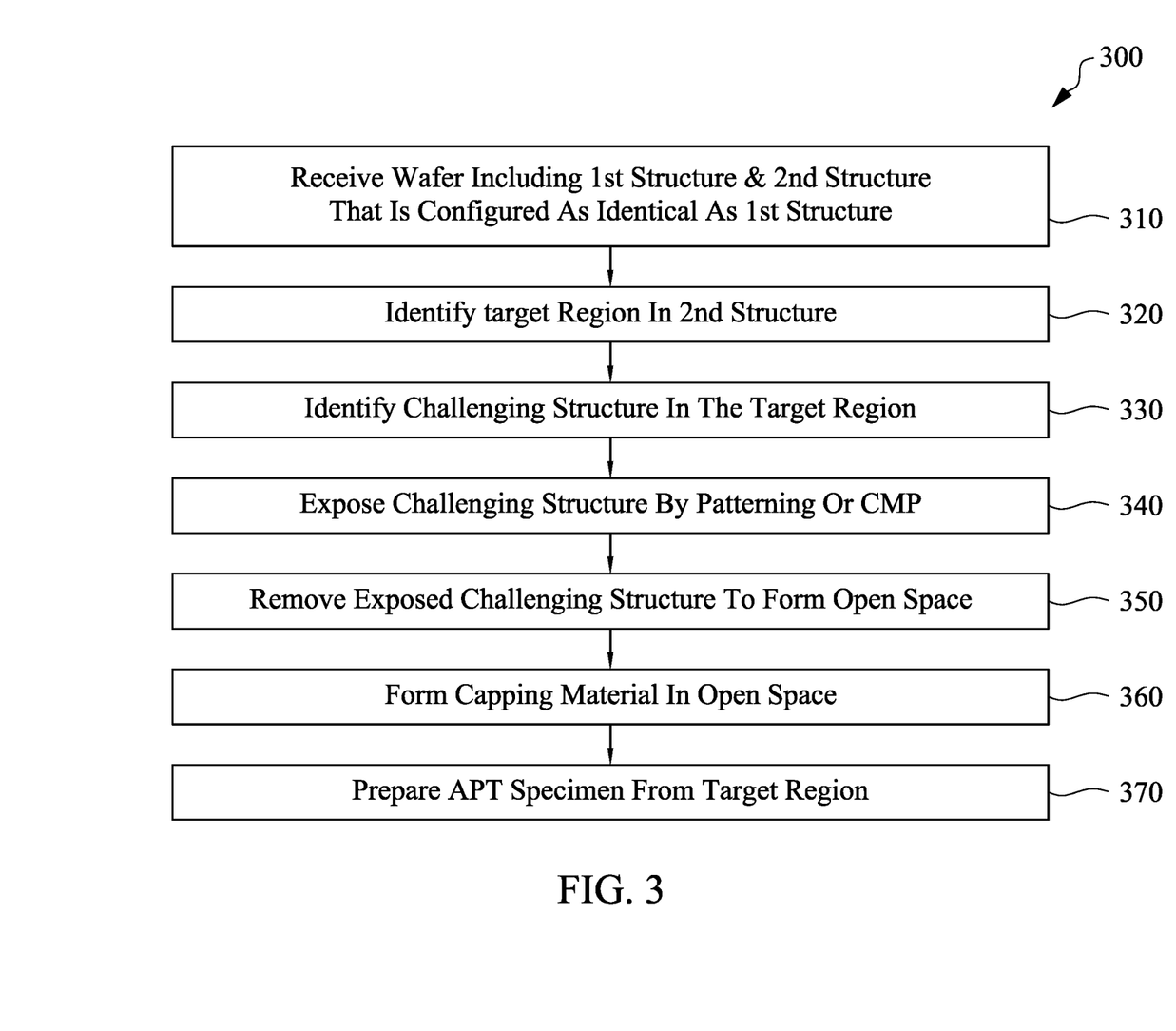
FIG. 3 is an example process according to example embodiments of the disclosure.

FIG. 3 shows an example process 300 of forming a substitute component on an existing wafer to replace a challenging component that poses challenges for an APT procedure. FIGS. 4A to 4E show a wafer 400 in various stages of implementing the example process 300.

Figure 4A:
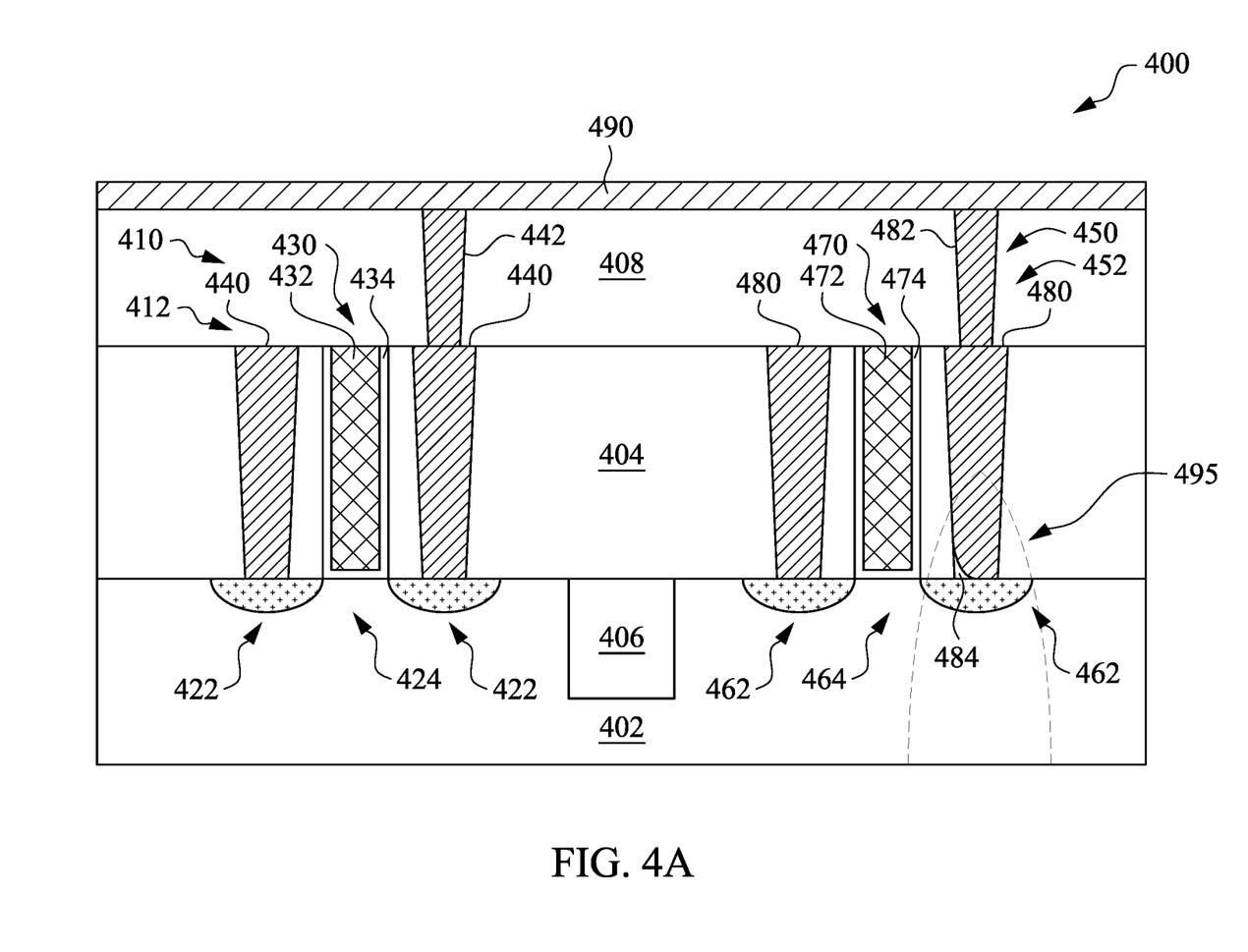
FIGS. 4A to 4E illustrate an example wafer in various stages of the example process of FIG. 3.

Referring to FIG. 3, with reference also to FIG. 4A, in example operation 310, a wafer 400 is received. In an example, the wafer 400 is a fully fabricated wafer, e.g., the wafer 400 is ready for the back-end testing and assembly processes. In another example, the wafer 400 is partially completed, with the front-end of line ("FEOL") processes completed and back-end of line ("BEOL") processes started. The wafer 400 may also in other stages of fabrication, which are all included in the disclosure.

As shown in FIG. 4A, the wafer 400 includes a substrate 402, e.g., a silicon substrate, multiple STI 406 in the substrate 402 and interlayer dielectric layer 404 over the substrate 402. The wafer 400 includes a first structure 410 and a second structure 450 that are configured to be identical to one another. In an embodiment, the first structure 410 includes a first transistor device 412, and the second structure 450 includes a second transistor device 452. The first transistor device 412 and the second transistor device 452 are separated by the STI 406. In an embodiment, the first transistor device 412 and the second transistor device 452 are substantially identical to one another in that the source/drain region 422, the body 424, and the gate structure 430 of the first transistor device 412 are each very similar to the source/drain region 462, the body 464, and the gate structure 470 of the second transistor device 452. The first structure 410 includes a first contact plug 440 connecting to the source/drain region 422 of the first transistor device 412. The second structure 450 includes a second contact plug 480 connecting to the source/drain region 462 in a same manner (or configured to be in the same manner) as the contact plug structure 440 connecting to the source/drain region 422.

The contact plug 440 is connected to a metal line 490 through an interconnect structure 442, e.g., a contact plug or via, and the contact plug 480 is connected to the metal line 490 through an interconnect structure 482, e.g., a contact plug or via. Another interlayer dielectric layer 408 is positioned above the interlayer dielectric layer 404 and surrounds the interconnect structures 442 and 482.

In an example, as shown in FIG. 4A, a hollow region 484 exists between the contact plug 480, the interlayer dielectric 404 and the source/drain region 462. In an example, the hollow region 484 is unintentionally formed due to the imperfect gap-filling property of a damascene process of forming the contact plug 480 within an aperture opened within the interlayer dielectric layer 404 for forming the contact plug 480.

The example structure 400 of FIG. 4A is shown as an illustrative example, which does not limit the scope of the disclosure. The techniques of the disclosure, as described herein, may be used for any semiconductor structures.

In example operation 320, a target zone 495, referred to using dotted line, is identified as a region on the second structure 450 that is relevant to obtaining an APT specimen, e.g., the target region 495 is identified as where the APT specimen is taken from, or where the APT specimen is possibly taken from. The target region 495 is determined based on a test object to be analyzed by the APT procedure, the size of the specimen, and other suitable criteria. For example, the dopant concentration and distribution within the source/drain region 462 may be the test object of the APT procedure. With a specimen diameter of as small as 10 nm, and the source/drain region diameter of about 20 nm, the tip of the specimen will, or possibly will, extend into the contact plug 480, as shown by the dotted line 495.

In example operation 330, a challenging component is identified on the target region. In an embodiment, the contact plug 480 is a conductive material that is difficult to evaporate in the APT procedure, e.g., tungsten. Further, the unintentionally formed hollow region 484 is also included in the target region 495, which may pose challenges to a successful preparation of the specimen or a successful 3D reconstruction of the specimen. As such the contact plug 480 and the hollow region 484 are considered challenging components in the target region 495 of the APT procedure.

Figure 4B:
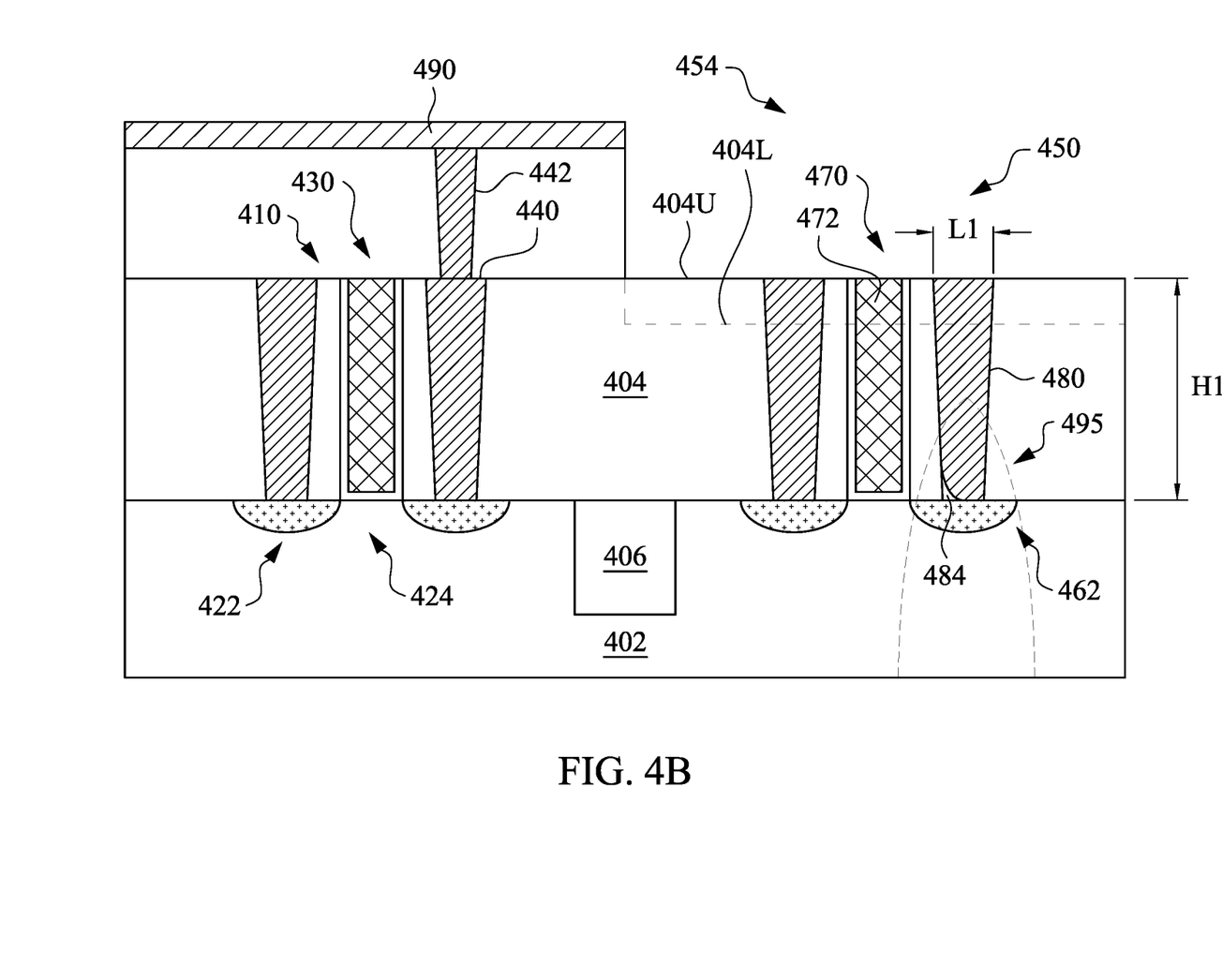

In example operation 340, with reference also to FIG. 4B, the challenging components are exposed or opened (referred to as "exposing" herein) by one or more of a patterning process/etching process or a polishing process, e.g., CMP. The exposing may be conducted globally on the entire surface of the wafer 400, or may be conducted regionally and specifically for the wafer surface area 454 relevant to the target region 495, as shown in FIG. 4B as an illustrative example.

In the exposing, the layers that overlay the challenging components are removed. Here, for example, the metal line 490, the interconnect 482 and the dielectric layer 408 are removed to expose the contact plug 480. FIG. 4B shows, as an illustrative example, that the challenging contact plug 480 of tungsten is exposed at the upper surface 404U of the interlayer dielectric layer 404, which is not limiting. In some embodiments, the contact plug 480 may be exposed at a level 404L that is lower than the upper surface 404U of the interlayer dielectric layer 404. In some embodiment, the height H1 of the exposed contact plug structure 480 is controlled with respect to the length L1 of exposed contact plug structure 480 such that the aspect ratio of the exposed contact plug 480 is less than a threshold. The aspect ratio threshold is determined based on one or more of the capping material to be used to replace the tungsten material of the exposed contact plug 480 or the deposition process for forming the capping material. For example, some deposition processes, e.g., ALD, have good gap-filling properties but are not suitable for high aspect ratio structures. In an embodiment, the aspect ratio between the height H1 and the length L1 of the exposed contact plug 480 is less than about 4:1.

FIG. 4B shows that the challenging contact plug 480 is exposed but the challenging hollow region 484 is not exposed. As described herein, the hollow region 484 is exposed in another process.

Figure 4C:
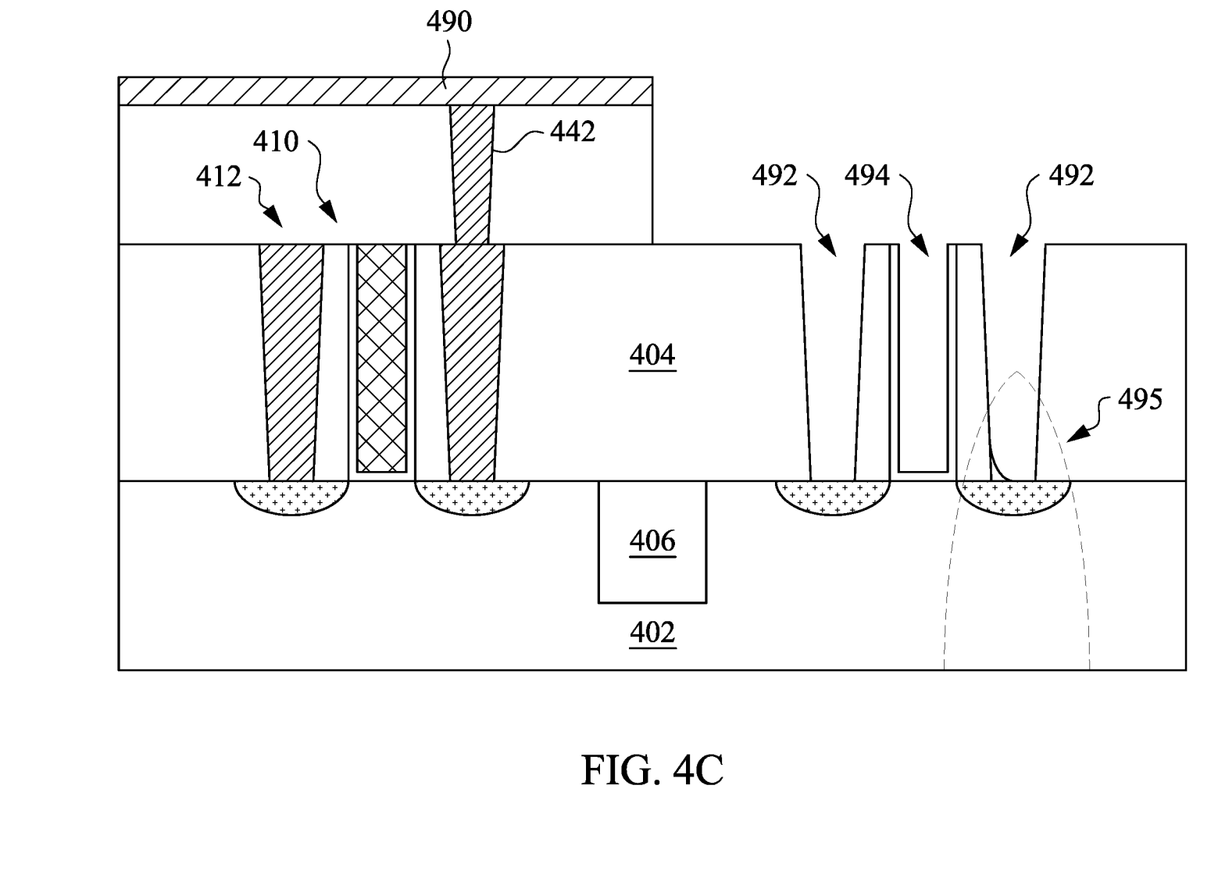

In example operation 350, with reference also to FIG. 4C, the challenging contact plug 480 is removed through etching. An open space 492 is formed through the removal of the challenging contact plug 480. In a non-limiting embodiment, as shown in FIG. 4C, the gate electrode 472 of the gate structure 470, as a challenging component proximate to the target region 495, is also removed, which forms an open space 494.

As shown in FIG. 4C, through the removal of the contact plug 480, the challenging hollow region 484 is also exposed and removed.

In an embodiment, the removal of the contact plug 480 exposes the source/drain region 462. In some scenarios, the exposed source/drain region 462 may be slightly affected by the etching process. Depending on the APT procedure design and/or the etchants used in removing the contact plug 480, such affection is acceptable and/or duly considered in the APT analysis to resolve the impact.

Figure 4D:
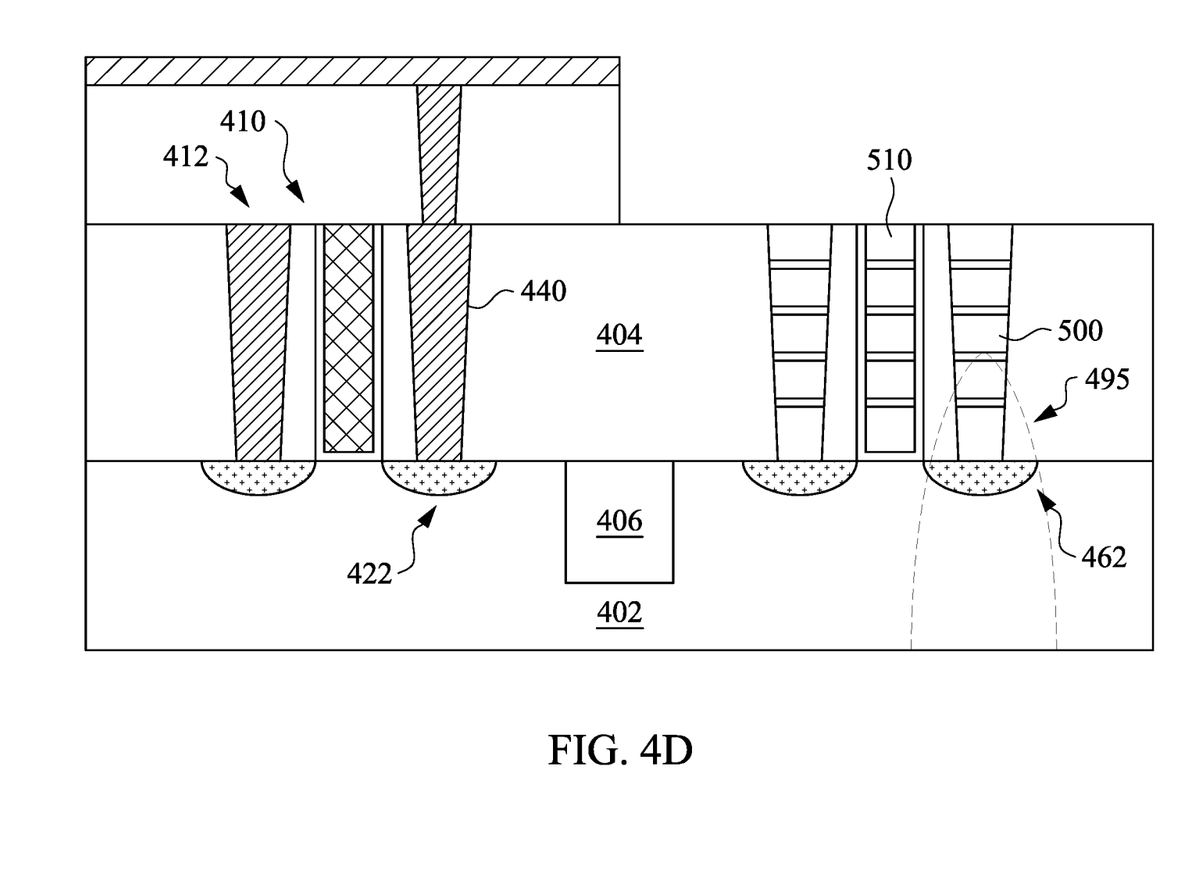

In example operation 360, with reference also to FIG. 4D, a substitute component 500 of a capping material is formed within the open space 492. The capping material is selected to be easy to evaporate in the APT procedure, identifiable with respect to an adjacent layer or structure, and/or suitable for the APT specimen preparation process. For example, the capping material is identifiable with respect to the material of the APT test object, here the source/drain region 462. Specifically, the capping material is identifiable with respect to the semiconductor material of the source/drain region 462 and the impurity or dopants in the source/drain region 462. A material is identifiable with respect to another material if their peaks in the mass spectrum do not overlap.

For example, the capping materials for the substitute component 500 are one or more of Co, Ni, AlO, TiO, ZnO, TaN, TiN, which are also identifiable with respect to the low-K dielectric material of the interlayer dielectric layer 404. Carbon- and oxygen-based organic compound materials are also used for the capping material.

The capping material is deposited using atomic layer deposition ("ALD"), molecular layer deposition ("MLD") or other suitable deposition processes that have good gap-filling properties. Due to the good gap-filling properties, as shown in FIG. 4D, the substitute component 500 replaces both the challenging contact plug 480 and the challenging hollow region 484. That is, the hollow region 484 is filled with the capping material.

As shown in FIG. 4D, in an embodiment, a substitute component 510 is also formed within the open space 494 where the gate electrode 474 is removed from.

Figure 4E:
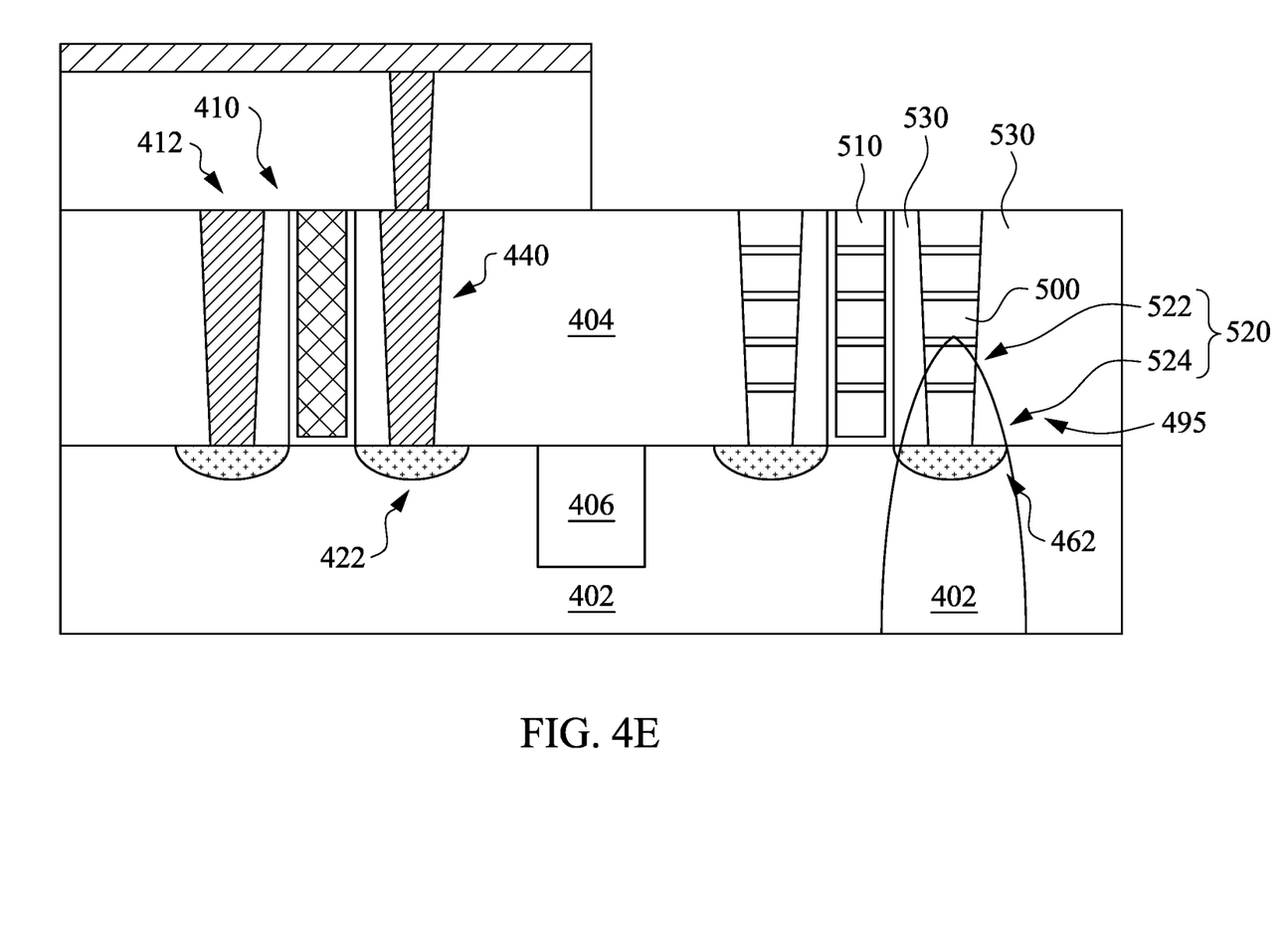

In example operation 370, with reference also to FIG. 4E, an APT specimen 520 is extracted from the target region 495 using any suitable approaches. The APT specimen 520 includes a first portion 522 and a second portion 524 adjacent to the first portion 522. The first portion 522 includes the capping material of the substitute component 500. The second portion 524 includes materials of the test object source/drain region 462. The test object source/drain region 462 is configured as identical to the source/drain region 422 of the first structure 410. On the specimen 520, a capping material of the substitute component 500 is adjacent to the material of the source/drain region 462. As such the specimen 520 includes a different material adjacent to the source/drain region 462 from that of the first structure 410.

More specifically, the specimen 520 is used to test the dopant concentration and distribution in the source/drain region 422 of the transistor device 412. Compared to the source/drain region 422, which is adjacent to the tungsten contact plug 440, the specimen 520 includes a second portion 524 that represents the source/drain region 422 and a first portion 522 that includes a material different from that of the contact plug structure 440. Such a specimen 520 enables a more successful removal of the ions from the second portion 524 because the first portion 522 material is easier to evaporate than the tungsten of the contact plug structure 440. Further the specimen 520 is more structurally sound because the hollow region 484 is replaced with the solid capping material.

The specimen 520 may be prepared from the target region 495 using focused ion beam milling ("FIB"). A lift-out method is used to extract a lamella from the target region 495. The lamella includes multiple shanks. The shanks are each annularly milled to achieve the hemispherical tip of the specimen 520. Due to the relatively small dimensions of the source/drain region 462, which is in the range of about 20 nm to about 40 nm diameter in surface area, the precise positioning of the specimen 520 is important. It is possible that the positioning of the specimen 520 is not perfectly accurate. As such, it is also important that the test object, here the source/drain region 462, is identifiable from the surrounding or adjacent materials in the specimen 520. In the case that some adjacent materials, e.g., the interlayer dielectric layer 404 adjacent to the source/drain region 462, is not identifiable from the source/drain region 462 in the APT procedure, the disclosed technique may be used to replace such surrounding materials with a capping material that is identifiable from the test object.

For example, as shown in FIG. 4E, the portions 530 of the dielectric layer 404, which are included in or adjacent to the target region 495, may be removed and replaced with a material that is more identifiable with respect to the materials of the source/drain region 462.

Other approaches for specimen preparation include electropolishing, micropolishing ("microloop") or other suitable approaches.

In addition, the APT specimen may be obtained from the front side, e.g., the tip of the APT specimen pointing to the upper level of the wafer, the back side, e.g., the tip of the APT specimen pointing to the lower level of the wafer, or from the cross-sectional direction, e.g., the tip of the APT specimen pointing to a lateral direction of the wafer, or from any other angular directions. The disclosure includes all APT specimen preparation approaches and is not limited by any specific one of them.

The description herein uses the dopant concentration and distribution within a source/drain region as an illustrative example of an APT test object. It should be appreciated that the techniques may be used for APT procedures to analyze other test objects. For example, the techniques can be used in an APT procedure to analyze the channel region 464 or the dielectric layer 404.

For example, an APT procedure may be conducted to analyze a doping area in the dielectric layer 404 to determine the straining effect of the doping. The stress introduced within the dielectric layer 404 by the straining may be adjacent to a metal interconnect structure to improve the metal dielectric interface characteristics. The target region may encompass the metal interconnect structure, which may be difficult to evaporate in field evaporation. The metal interconnect structure may be replaced with a capping material under the disclosed techniques.

The source/drain regions 122, 162, 422, 462 includes one or more of Ge, Si, GaAs, AlGaAs, SiGe, GaAsP, SiP, SiC, silicon-carbon-phosphide ("SiCP"), silicon-germanium-boron ("SiGeB"), or other suitable semiconductor materials, and may be doped in-situ during the epitaxy process by the supply of impurity sources, or may be doped through post implantation process. The possible dopants include boron for SiGe, carbon for Si, phosphorous for Si or SiCP.

The gate electrode 132, 432, 472 includes a conductive material, e.g., a metal or a metal compound. Suitable metal materials for the gate electrode 132, 432, 472 include ruthenium, palladium, platinum, cobalt, nickel, and/or conductive metal oxides and other suitable P type metal materials, and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N type metal materials. In some examples, the gate electrode 432, 472 includes a work function layer tuned to have a proper work function for enhanced performance of the field effect transistor devices. For example, suitable N type work function metals include Ta, TiAl, TiAlN, TaCN, other N type work function metal, or a combination thereof, and suitable P type work function metal materials include TiN, TaN, other p-type work function metal, or a combination thereof. In some examples, a conductive layer, such as an aluminum layer, is formed over the work function layer such that the gate electrode 132, 432, 472 includes a work function layer disposed over the gate dielectric 134, 434, 474, and a conductive layer disposed over the work function layer and below the gate cap. In an example, the gate electrode 132, 432, 472 has a thickness ranging from about 5 nm to about 40 nm depending on design requirements.

The gate dielectric layer 134, 434, 474 includes a high dielectric constant (high K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), combinations thereof, and/or other suitable materials. A high K dielectric material, in some applications, may include a dielectric constant (K) value larger than 6. Depending on design requirements, a dielectric material of a dielectric contact (K) value of 9 or higher may be used. The high K dielectric layer 134, 434, 474 may be formed by atomic layer deposition (ALD) or other suitable technique. In accordance with embodiments described herein, the high K dielectric layer 134, 434, 474 includes a thickness ranging from about 10 to about 30 angstrom (Å) or other suitable thickness.

The substrate 102, 402 may include a silicon substrate in crystalline structure and/or other elementary semiconductors like germanium. Alternatively or additionally, the substrate 102, 402 may include a compound semiconductor such as silicon carbide, gallium arsenide, indium arsenide, and/or indium phosphide. Further, substrate 120 may also include a silicon-on-insulator (SOI) structure. The substrate 102, 402 may include an epitaxial layer and/or may be strained for performance enhancement. The substrate 102, 402 may also include various doping configurations depending on design requirements as is known in the art such as p-type substrate and/or n-type substrate and various doped regions such as p-wells and/or n-wells.

The semiconductor structure/transistor device 112, 412, 452 is a lateral or a vertical transistor, or other semiconductor devices like discrete devices. The transistor is finFET, tunnel FET ("TFET"), gate-all-around ("GAA") or other advanced devices that requires 3D reconstruction of the test object in an APT procedure.

The field evaporation may be performed in a Cameca FlexTap 3D Atom Probe or other suitable APT equipment.

The described examples and the components thereof may be combined, recombined in various ways, which are all included in the scope of the disclosure.

The present disclosure may be further appreciated with the description of the following embodiments:

In a method embodiment, a wafer is received. The wafer includes a substrate, a semiconductor body having a semiconductor material and an impurity over the substrate, a metal structure of a metal material over the semiconductor body and a dielectric layer of a dielectric material adjacent to the metal structure. The metal structure is exposed. A first open space is formed exposing the semiconductor body by removing at least a portion of the metal structure. A capping layer of a capping material is formed in the first open space. An atom probe tomography specimen is obtained from the semiconductor body and the capping layer.

In another method embodiment, a wafer is received, which has a semiconductor structure. A target region is identified in the semiconductor structure as relevant to preparing an atom probe specimen. A first structural element is identified in the target region. The first structural element is replaced with a second structural element. An atom probe specimen is prepared from the target region after the replacing.

In a structure embodiment, a wafer includes a substrate, a first structure and a second structure over the substrate. The first structure includes a first semiconductor body and a first upper structure over the first semiconductor body. The second structure includes a second semiconductor body and a second upper structure over the second semiconductor body. The first semiconductor body and the second semiconductor body are in a same layer and are substantially identical to one another. The first upper structure and the second upper structure include different materials from one another.

Another structure embodiment includes an atom probe tomography specimen used for analyzing a test object region in a semiconductor structure. The test object region is adjacent to a first structure of a first material. The atom probe tomography specimen includes a first portion having a second material that is easier to evaporate in field evaporation than the first material of the first structure and a second portion having a same material as the test object region, the second portion being further away from a tip of the atom probe tomography specimen than the first portion.

What is claimed is:

1. A method, comprising:
   receiving a wafer, the wafer including a substrate, a semiconductor body having a semiconductor material and an impurity over the substrate, a metal structure of a metal material over the semiconductor body and a dielectric layer of a dielectric material adjacent to the metal structure;
   exposing the metal structure;
   forming a first open space exposing the semiconductor body by removing at least a portion of the metal structure;
   forming a capping layer of a capping material in the first open space; and obtaining an atom probe tomography specimen from the semiconductor body and the capping layer.

2. The method of claim 1, wherein the capping material is identifiable with respect to the semiconductor material and the impurity in a mass spectrum.

3. The method of claim 1, wherein the capping material is identifiable with respect to the dielectric material in a mass spectrum.

4. The method of claim 1, wherein the exposing the metal structure includes reducing a height of the metal structure such that after the exposing the metal structure, an aspect ratio of the metal structure is smaller than a threshold.

5. The method of claim 1, further comprising:
forming a second open space by removing a structure adjacent to the metal structure; and
forming the capping layer in the second open space.

6. The method of claim 1, further comprising:
identifying a hollow region adjacent to the metal structure;
exposing the hollow region; and
forming the capping layer in the exposed hollow region.

7. The method of claim 1, wherein the capping material includes an evaporation field lower than an evaporation field of the metal material.

8. The method of claim 7, wherein the metal material includes one or more of W, Re, Os, Ir, Pt, Au, Nb, Mo, Ru, and Rh.

9. A method, comprising:
receiving a wafer having a semiconductor structure;
identifying a first region in the semiconductor structure;
identifying a first structural element in the first region;
replacing the first structural element with a second structural element; and
preparing an atom probe specimen from the first region after the replacing,
wherein the first region includes a test object of an atom probe tomography analysis, and the first structural element includes a material that is unidentifiable with respect to a material of the test object.

10. The method of claim 9, wherein the first structural element is one or more of a metal structure or a hollow region.

11. The method of claim 9, wherein the second structural element includes a material that is easier to evaporate in an atom probe tomography procedure than a material of the first structural element.

12. A method, comprising:
receiving a wafer, the wafer including:
a substrate,
a first structure and a second structure over the substrate, and
a dielectric layer between the first structure and second structure, the first structure including a first semiconductor body and a first upper structure over the first semiconductor body, the second structure including a second semiconductor body and a second upper structure over the second semiconductor body, the first semiconductor body and the second semiconductor body in a same layer and substantially identical to one another, the first upper structure and the second upper structure substantially identical to one another, and the dielectric layer surrounding the first upper structure and the second upper structure;
forming an aperture in the dielectric layer by removing the second upper structure by etching;
forming a third upper structure in the aperture, the third upper structure having a different material from the first upper structure; and
forming an atom probe tomography test sample that includes at least a portion of the third upper structure, the forming the atom probe tomography test sample including:
extracting a lamella that includes at least the portion of the third upper structure, the lamella including a plurality of shanks; and
annularly milling a shank of the plurality of shanks using focused ion beam milling.

13. The method of claim 12, wherein a material of the third upper structure is easier to evaporate in field evaporation than a material of the first upper structure.

14. The method of claim 12, wherein the first upper structure is one of a gate structure or an interconnect structure.

15. The method of claim 12, wherein the first upper structure includes a metal material and the third upper structure includes a polysilicon material.

16. The method of claim 12, wherein the first upper structure includes a metal material and the third upper structure includes a dielectric material.

17. The method of claim 12, wherein the first structure and the second structure are positioned in a region of the wafer designated to be segmented into a die for an integrated circuit.

* * * * *